United States Patent [19]
Birrittella et al.

[11] Patent Number: 4,964,081
[45] Date of Patent: Oct. 16, 1990

[54] READ-WHILE-WRITE RAM CELL

[75] Inventors: Mark S. Birrittella; Jan A. Wikstrom, both of Chippewa Falls, Wis.

[73] Assignee: Cray Research, Inc., Eagan, Minn.

[21] Appl. No.: 393,528

[22] Filed: Aug. 11, 1989

[51] Int. Cl.$^5$ ............................................. G11C 13/00
[52] U.S. Cl. ............................ 365/189.06; 365/154; 365/179
[58] Field of Search ................. 365/189.01, 189.04, 365/189.06, 230.01, 154, 179

[56] References Cited

U.S. PATENT DOCUMENTS

| | | |
|---|---|---|
| 4,580,244 | 4/1986 | Birrittella . |
| 4,635,087 | 1/1987 | Birrittella et al. . |
| 4,656,495 | 4/1987 | Birrittella . |
| 4,697,251 | 9/1987 | Birrittella et al. . |
| 4,701,882 | 10/1987 | Birrittella et al. . |
| 4,701,883 | 10/1987 | Wrathall et al. . |
| 4,916,667 | 4/1990 | Miyabayashi .................. 365/189.04 |

*Primary Examiner*—Terrell W. Fears
*Attorney, Agent, or Firm*—Merchant, Gould Smith, Edell Welter & Schmidt

[57] ABSTRACT

A READ-WHILE-WRITE current-mode logic RAM cell suitable for use in a RAM device having the ability to simultaneously write and read data.

The RAM cell contains a bit-cell consisting of flip-flop configured transistors differentially connected to a constant current source, a multiple-emitter transistor network tied to each bit-cell load resistor which prevents the bit-cell from saturating, separate READ and WRITE data lines, and READ and WRITE buffer transistors having READ and WRITE control lines.

16 Claims, 1 Drawing Sheet

READ-WHILE-WRITE RAM CELL

FIELD OF THE INVENTION

The present invention relates to the design of random access memory (RAM) cells. The present invention particularly relates to a current-mode RAM cell with independent READ and WRITE lines and bit-cell saturation prevention by a multiple-emitter transistor.

BACKGROUND OF THE INVENTION

Modern digital processors, such as computers, usually require a means of storing digital information for later use. Various well-known methods of storing and retrieving information are available to the designer. However, when the application requires that digital information be temporarily stored for subsequent quick retrieval, Random Access Memory (RAM) is generally used.

A RAM device generally consists of one or more semiconductor devices which store digital information in address locations. A RAM device must provide a means for storing data, a means for writing (WRITE) data into particular cells at selected address locations, and a means for reading (READ) the data stored in the cells at particular address locations.

The basic digital storage element of a RAM device is a bit-cell. A single bit-cell can store one bit of digital data. By connecting a bit-cell to circuitry for writing and reading the bit-cell data, a cell is formed. By connecting many cells to address circuitry, the RAM device itself is formed.

The conventional bit-cell itself is a flip-flop circuit. A flip-flop is usually formed by two transistors arranged in a complimentary, cross-coupled configuration. A bit-cell can store information in one of two possible logic states. The first logic state corresponds to a first flip-flop transistor conducting. The second logic state corresponds to conduction by the second flip-flop transistor. In each case only one of the complimentary transistors is conducting.

In many applications it is desirable for the logic state of the bit-cell to switch from one state to the other as rapidly as possible. To increase the switching speed, the bit-cell can be designed so that rather than turning the current in each flip-flop transistor ON and OFF, a fixed current is steered from one flip-flop transistor to the other. Logic circuitry, such as a bit-cell, whose operation is based on the principle of current steering is frequently called current-mode logic.

One method of operating a bit-cell in the current-mode is to differentially connect the flip-flop transistors. For example, the emitters of the transistors may be connected together and coupled to a relatively constant current source. While this topology speeds up the bit-cell, it may increase the potential for alpha particle noise instability and saturation.

Alpha particles induce noise in semi-conductor materials by disturbing the generation and recombination of charge carriers. This noise shows up as current fluctuations in conduction currents. With the bit-cell current-mode operated, the voltage swings across the load resistors of the bit-cell transistors are reduced because of the voltage dropped by the constant-current source. Alpha particles may then generate enough current fluctuations so that the voltage across the load resistor of the conducting flip-flop transistor drops enough to cause the bit-cell to change state.

One well known method of reducing alpha particle problems is to increase the voltage swing required across the load resistors for the bit-cell to change state. A common way to accomplished this is to design the bit-cell using high ohmic value load resistors. However, this solution slows down the circuit operation because transistor interelectrode capacitances must charge through these load resistances before switching can take place.

Also, the use of large value load resistors slows down circuit operation by causing saturation of the transistors. Saturation occurs when charges are injected into the base-collector junction when the base-collector junction becomes forward biased. As explained in more detail below, to maximize bit-cell operating speed the flip-flop transistors must not saturate since the injected charges become stored and must be recombined or removed before the saturated transistor can stop conducting.

Logic designs which prevent flip-flop transistors from saturating are well known. One common method is to connect the bit-cell load resistors in parallel with devices that can dump current into the collector. This prevents the collector-base junction from becoming forward biased. A common method of doing this is to use P-N junction diodes in parallel with the load resistors of the flip-flop transistors. However, this design shows limited improvement in switching speeds because the P-N junction diodes themselves store charges in their junction, if it becomes forward biased, which must be removed before switching. Use of Schottky diodes instead of P-N junction diodes solves the saturation problem since Schottky diodes cannot accumulate charges. However, the inclusion of Schottky diodes increases the difficulty of fabricating the cell on a semiconductor wafer.

As mentioned above, cells are made by adding methods to WRITE and READ the bit-cell. When designing cells, tradeoffs involving cell READ and WRITE access times, switching speeds, dynamic range, power dissipation, cell size, cell fabrication complexity, noise margins, external circuit complexity, and many other parameters must be made to achieve the optimal design for a given application. As indicated earlier however, when high speed is required a non-saturating current-mode logic bit-cell is preferred. For optimum cell operation, the bit-cell transistors must be stable, not saturate, and have low resistances in series with interelectrode capacitances.

In conventional cells, saturation of the bit-cell tends to occur during a WRITE operations. This is because a WRITE operation requires the highest current through the load resistor of the conducting transistor and therefore may lower the collector voltage of the conducting transistor enough to forward bias the collector-base junction.

In a conventional cell, a READ or WRITE of the logic state of the bit-cell is performed using the same access path to the bit-cell. In some applications this is undesirable since overall functional operating speed may be increased and/or external circuit complexity may be reduced if independent READ and WRITE access lines to the bit-cell are available. Additionally, separate READ and WRITE access lines would be needed to enable concurrent reading and writing of memory cells.

A RAM cell design is known, shown in U.S. Pat. No. 4,701,883, that has separate READ and WRITE signal lines. However, this cell cannot be used in RAM devices where a simultaneous READ of one word and a WRITE of another is desired. This follows because a RAM device using the 4,701,883 cell would connected READ and WRITE data lines of the cell to the corresponding data lines of many similar cells. If simultaneous READ and WRITE operations were to occur, input power would have to be applied to the word lines of the words being written and read. When writing one word, the second word, attempting to be read, would be over-written.

SUMMARY OF THE INVENTION

The preferred embodiment of the present invention solves the problems described above by providing a READ-WHILE-WRITE current-mode logic RAM cell suitable for use in a RAM device that permits simultaneous writing of one word while reading another. The RAM cell consisting of a bit-cell comprised of flip-flop configured transistors differentially connected to a substantially constant current source, a multiple-emitter transistor network which prevents the bit-cell from saturating, and independent READ and WRITE data lines.

BRIEF DESCRIPTION OF THE DRAWINGS

The features of the present invention will become more apparent with reference to the accompanying drawing and the following description thereof. The sole FIGURE is a schematic diagram of the preferred embodiment.

DESCRIPTION OF THE PREFERRED EMBODIMENT

Figure 1:
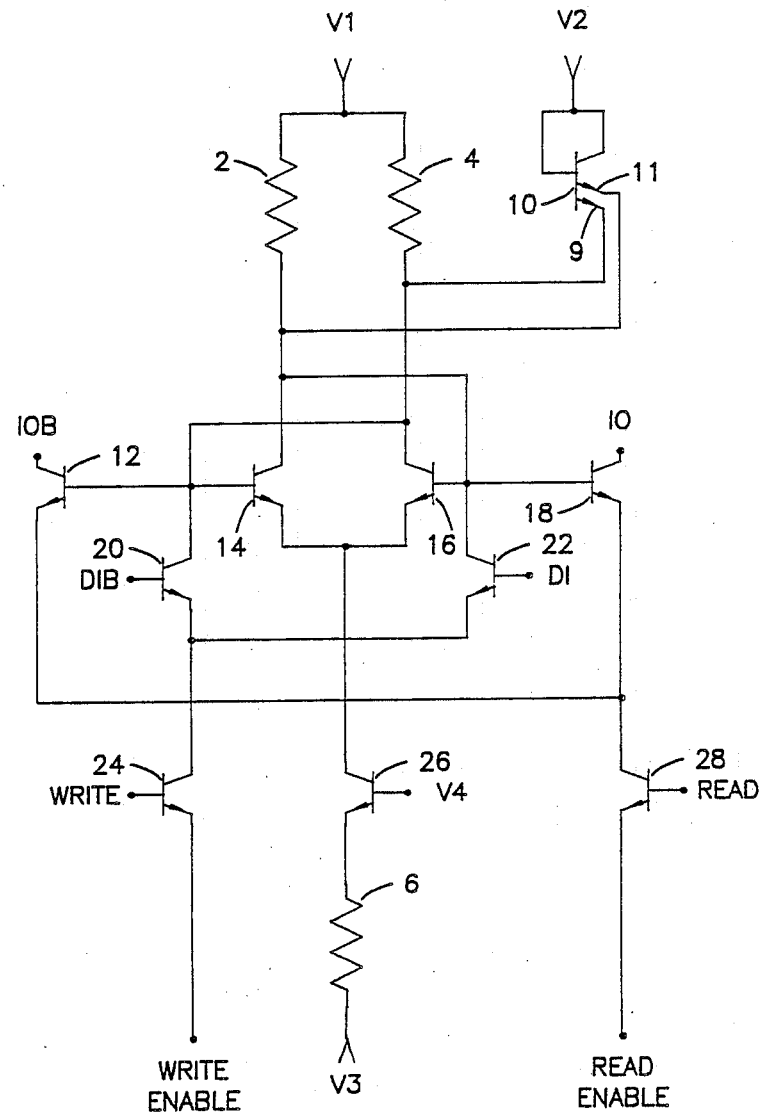

In the following detailed description of the preferred embodiment, reference is made to the sole FIGURE which forms a part hereof, and in which the invention may be practiced. This embodiment is described in sufficient detail to enable those skilled in the art to practice the invention and it is to be understood that other embodiments may be utilized without departing from the spirit and scope of the present invention. The following detailed description is therefore not to be taken in a limiting sense and the scope of the present invention is defined by the appended claims.

Cross-coupled transistors 14 and 16 form the flip-flop of the cell. The base of transistor 16 connects to the collector of transistor 14 forming node 1, the base of transistor 14 connects to the collector of transistor 16 forming node 2, and the emitter of transistor 14 connects with the emitter of transistor 16 forming node 3.

The flip-flop will hold either one of two states as directed by the WRITE circuitry. One state is defined as transistor 14 conducting current and transistor 16 not conducting, the other is defined as transistor 14 not conducting current and transistor 16 conducting. Assume that transistor 14 is conducting. Node 1 is at a lower voltage then node 2. Current flows through resistor 4 into the base of transistor 14, allowing transistor 14 to supply the current required by the constant current source described below. Node 3 is then one base-emitter voltage drop less then node 2.

In the preferred embodiment the conducting flip-flop transistor, either 14 or 16, is operated with the collector-base junction approximately 0.4 volts forward biased. This allows resistors 2 and 4 to be of a high ohmic value so that voltage swings at the collectors of transistors 14 and 16 are increased, which improves alpha particle noise immunity. The preferred embodiment includes a saturation prevention circuit consisting of a multiple-emitter transistor 10 which is operated near conduction via emitter 11. If transistor 14 starts to approach still closer to saturation, such as during a WRITE, the voltage at node 1 drops. This turns on transistor 10 via emitter 11 which conducts current into node 1, preventing transistor 14 from achieving saturation.

The current flow through transistor 14 is limited by the constant current source consisting of transistor 26, resistor 6, and voltage sources V3 and V4. The action of the constant current source keeps transistor 14 conducting and transistor 16 off since transistor 14 supplies, through resistor 2, all of the current required by the constant-current source. This current flow through resistor 2 places node 1 at a lesser potential than node 2, and with node 3 one base-emitter drop less than node 2 as noted above, transistor 16 does not conduct. Transistor 14 will continue to conduct until node 2 is reduced in voltage enough so that the constant current source is supplied by transistor 16. If transistor 16, instead of transistor 14, is conducting a similar operation involving transistor 16 occurs.

In the preferred embodiment, the constant current source is configured with the base of transistor 26 connected to voltage V4, the collector of transistor 26 connected to node 3 and resistor 6 connected between the emitter of transistor 26 and voltage V3. The magnitude of the constant current source is selected to minimize cell power dissipation while reliably holding the conducting transistor of the bit-cell on. The constant current magnitude can be set by adjusting the voltage loop consisting of voltages V4 and V3, resistor 6, and the base-emitter junction of transistor 26. The constant current magnitude is equal to voltage V4 minus voltage V3 minus the base-emitter voltage drop of transistor 26 all divided by the resistance of resistor 6. In the preferred embodiment V3 is −4.5 volts, V4 is −3.18 volts, resistor 6 is 2,850 ohms, the base-emitter voltage drop of 26 is approximately 0.78 volts, which gives a current source value of approximately 0.0002 amperes.

The load portion of the bit-cell includes resistor 2, resistor 4, and a saturation prevention circuit consisting of multiple-emitter transistor 10. Resistor 2 connects between node 1 and a voltage source V1. Resistor 4 connects between node 2 and voltage source V1. Transistor 10 is arranged with its collector connected to its base and also to a voltage source V2, thereby forming a node 6. In the preferred embodiment, voltage source V2 is approximately one-half of a base-emitter voltage drop less than voltage source V1. Emitter 9 connects to node 2 and emitter 11 connects to node 1.

As explained above, resistor 2 exhibits a high ohmic value so that the voltage swing at node 1 is great enough to avoid alpha particle induced problems. However, resistor 2 must also be of a low enough ohmic value that circuit operation is not slowed by the time required for stray capacitances to charge through resistor 2. Resistor 4 is chosen in the same manner with respect to transistor 16. In the preferred embodiment, resistor 2 and resistor 4 are both approximately 2000 ohms.

With transistor 14 conducting, resistor 4 conducts the base drive current for transistor 14. In the preferred embodiment, the voltage drop across resistor 4 when transistor 14 is conducting is a small amount, close to 0 volts. When a high current is required through resistor 2, as during a WRITE operation, the voltage drop across resistor 2 turns on transistor 10 via emitter 11. Transistor 10 then supplies some of the required high current and limits node 1 to approximately 0.5 base-emitter voltage drops below V1. The collector-base junction of transistor 14 is then limited to a forward bias of approximately 0.5 base-emitter voltage drops and therefore does not saturate. A similar operation occurs to transistor 16 when it conducts.

The READ portion of the cell is comprised of transistors 12, 18, and 28. The base of transistor 12 connects to node 2, the emitter of transistor 12 connects to the emitter of transistor 18 forming a node 4, and the collector of transistor 12 is available to external circuitry to form the compliment of the stored bit. The base of transistor 18 connects to node 1, and the collector of transistor 18 is available to external circuitry to form the stored bit. The collector of transistor 28 connects to node 4. The base and emitter of transistor 28 form access points available to external circuitry to enable the READ circuitry. In the preferred embodiment of the present invention, the base and emitter of transistor 28 connect to the READ address circuitry of the complete RAM device, and the collector of transistor 12 and the collector of transistor 18 connect to the data output circuitry of the complete RAM device.

To READ the stored bit, transistor 28 is turned on by external circuitry. The exact manner of turning on transistor 28 depends on the external circuitry. All that is required is that the voltage at node 4 be brought one base-emitter voltage drop lower then the greater of the voltages at either node 1 or node 2. In the preferred embodiment of the present invention, the base and emitter of transistor 28 connect to the READ address circuitry of the complete RAM. If the voltage at node 1 is the greater, transistor 18 turns on and current will flow into the collector of transistor 18. If the voltage at node 2 is the greater, transistor 12 turns on and current will flow into the collector of transistor 12. The current into the collectors of transistors 12 and 18 can be monitored to indicate the state of the bit-cell.

The WRITE portion of the circuit is comprised of transistors 20, 22, and 24. The collector of transistor 20 connects to node 2, the emitter of transistor 20 connects to the emitter of transistor 22 forming a node 5, and the base of transistor 20 is available to external circuitry to input the compliment of the bit to be stored. The collector of transistor 22 connects to node 1, and the base of transistor 22 is available to external circuitry to input the bit to be stored. The collector of transistor 24 connects to node 5. The base and emitter of transistor 24 form WRITE control access points for use by the external circuitry. In the preferred embodiment of the present invention, the base and emitter of transistor 24 connect to the WRITE address circuitry of the complete RAM, and the base of transistor 20 and the base of transistor 22 connect to the data input circuitry of the complete RAM.

To WRITE the bit to be stored, transistor 24 is turned on. The manner of turning on transistor 24 depends on the external circuitry connected to the cell. In the preferred embodiment of the present invention, the base and emitter of transistor 24 connect to the WRITE address circuitry of the complete RAM. All that is required is that the voltage at node 5 be brought enough lower than the greater of either the data bit to be stored, or the compliment of the data bit to be stored, so that either transistor 20 or 22 can turn on when data is supplied. Then, when the external circuitry supplies the data bit to be stored, the data bit is written into the bit-cell as follows: If the base of 20 is turned on, node 2 is brought low, current for said constant current source flows through transistor 16. If the base of 22 is turned on, node 1 is brought low, current for said constant current source flows through transistor 14.

Concurrent READ and WRITE operations are allowed. Assume that transistors 24 and 28 are both conducting, i.e. READ and WRITE circuits are as required for concurrent READ and WRITE. Assume further that transistor 14 is conducting. Node 2 is then at a higher potential then node 1 and transistor 18 is off. As stated previously, the compliment of the data bit to be stored is applied to the base of transistor 20, and the data bit itself is applied to the base of transistor 22. If the base of transistor 22 goes high, node 1 is brought to a still lower voltage which causes no change in the logic state of the bit-cell or the READ transistors 12 and 18. However, if the base of transistor 20 goes high, the potential at node 2 drops below that of node 1. This causes the bit-cell to change state and transistor 18 to turn ON and transistor 12 OFF. A similar operation occurs if transistor 12 is off and transistor 18 is on. While a "race" condition exist, i.e. whether the bit-cell change state before the READ transistors, in the preferred embodiment the bit-cell transistors will change state first since they have been configured for maximum switching speeds. It is possible however to change the "race" result by configuring the READ circuit transistors 12, 18, and 28 differentially.

In accordance with provisions and statutes, there has been described and illustrated the preferred embodiment of the invention. However, those skilled in the art will appreciate that many changes may be made without departing from the spirit of the invention as set forth in the claims. Additionally, certain features of the invention may be used to advantage without a corresponding use of other features of the invention. Therefore, the following claims should be interpreted so as to encompass all equivalents which might suggest themselves to one skilled in the art upon a reading of the present specification.

We claim:

1. A nonsaturating differentially connected transistor memory cell comprising:

first and second transistors, each having a collector, base and emitter, arranged such that said collector of said first transistor is connected to said base of said second transistor forming a first node, said collector of said second transistor is connected to said base of said first transistor forming a second node, and said emitters of said first and second transistors are connected together forming a third node;

a constant current source coupled between said third node and a first electrical voltage establishing a predetermined substantially constant current through said third node wherein the sum of the currents through said first and second transistor emitters are restricted by said constant current source;

a first load providing an impedance coupled between said first node and a second electrical voltage;

a second load providing an impedance coupled between said second node and a third electrical voltage; and a saturation prevention circuit including a third transistor having a collector, base, and first and second emitters, arranged such that said collector and said base of said third transistor are connected both together and to a fourth electrical voltage forming a fourth node, said first emitter of said third transistor connected to said first node and said second emitter of said third transistor connected to said second node, said saturation prevention circuit operative to turn on said third transistor to prevent saturation of said first and second transistors.

2. The circuit according to claim 1 wherein said second and third electrical voltages are the same.

3. The circuit according to claim 2 wherein said fourth electrical voltage is approximately one-half of a base-emitter voltage drop less then said second and third voltages.

4. A READ-WHILE-WRITE bipolar memory cell for storing a single data bit, comprising:
- first and second transistors for storing said data bit, each having a collector, base and emitter, arranged such that said collector of said first transistor is connected to said base of said second transistor forming a first node, said collector of said second transistor is connected to said base of said first transistor forming a second node, and said emitters of said first and second transistors are connected together forming a third node; a constant current source coupled between said third node and a first electrical voltage establishing a predetermined substantially constant current through said third node wherein the sum of the currents through said first and second transistor emitters are restricted by said constant current source;
- a first load providing an impedance coupled between said first node and a second electrical voltage;
- a second load providing an impedance coupled between said second node and a third electrical voltage;
- first means for sensing said data bit stored in said first and second transistors in response to a READ signal;
- second means for setting said data bit to be stored in said first and second transistors in response to a WRITE signal; and
- a saturation prevention circuit including a third transistor having a collector, base, and first and second emitters, arranged such that said collector and said base of said third transistor are connected both together and to a fourth electrical voltage forming a fourth node, said first emitter of said third transistor connected to said first node and said second emitter of said third transistor connected to said second node, said saturation prevention circuit operative to turn on said third transistor to prevent saturation of said first and second transistors.

5. The circuit according to claim 4 wherein said second and third electrical voltages are the same.

6. The circuit according to claim 5 wherein said fourth electrical voltage is approximately one-half of a base-emitter voltage drop less then said second and third voltages.

7. A READ-WHILE-WRITE bipolar memory cell for storing a single data bit, comprising:
- first and second transistors for storing said data bit, each having a collector, base and emitter, arranged such that said collector of said first transistor is connected to said base of said second transistor forming a first node, said collector of said second transistor is connected to said base of said first transistor forming a second node, and said emitters of said first and second transistors are connected together forming a third node; a constant current source coupled between said third node and a first electrical voltage establishing a predetermined substantially constant current through said third node wherein the sum of the currents through said first and second transistor emitters are restricted by said constant current source;
- a first load providing an impedance coupled between said first node and a second electrical voltage;
- a second load providing an impedance coupled between said second node and a third electrical voltage;
- first means for sensing said data bit stored in said first and second transistors in response to a READ signal, said first means not substantially affecting current flow through said first and second transistors, and said first means further operative for supplying READ data outputs; and,
- second means for setting said data bit to be stored in said first and second transistors in response to a WRITE signal, said second means not substantially affecting total current flow through said first and second transistors, and said second means including means for supplying WRITE data inputs on lines different from those that supply READ data outputs.

8. The circuit according to claim 7 wherein said second and third electrical voltages are the same.

9. The circuit according to claim 7, wherein said first means comprises:
- a third transistor having a collector, base, and emitter, arranged such that an access terminal connects to said collector of said third transistor, said base of said third transistor connects to said second node;
- a fourth transistor having a collector, base, and emitter, arranged such that said emitter of said fourth transistor connects to said emitter of said third transistor forming a fifth node, said collector of said fourth transistor connects to an access terminal, and said base of said fourth transistor connects to said first node; and
- a fifth transistor having a collector, base, and emitter, arranged such that said collector of said fifth transistor connects to said fifth node, said base of said fifth transistor connects to an access terminal, and said emitter of said fifth transistor connects to another access terminal;

and wherein said second means comprises:
- a sixth transistor having a collector, base, and emitter, arranged such that an access terminal connects to said base of said sixth transistor, said collector of said sixth transistor connects to said second node;
- an seventh transistor having a collector, base, and emitter, arranged such that said emitter of said seventh transistor connects to said emitter of said sixth transistor forming a sixth node, said base of said seventh transistor connects to an access terminal, and said collector of said seventh transistor connects to said first node; and
- an eighth transistor having a collector, base, and emitter, arranged such that said collector of said eighth transistor connects to said sixth node, said base of said eighth transistor connects to an access terminal, and said emitter of said eighth transistor connects to another access terminal.

10. The circuit according to claim 9 wherein said second and third electrical voltages are the same.

11. A READ-WHILE-WRITE bipolar memory cell for storing a single data bit, comprising:

first and second transistors for storing said data bit, each having a collector, base and emitter, arranged such that said collector of said first transistor is connected to said base of said second transistor forming a first node, said collector of said second transistor is connected to said base of said first transistor forming a second node, and said emitters of said first and second transistors are connected together forming a third node; a constant current source coupled between said third node and a first electrical voltage establishing a predetermined substantially constant current through said third node wherein the sum of the currents through said first and second transistor emitters are restricted by said constant current source;

a first load providing an impedance coupled between said first node and a second electrical voltage;

a second load providing an impedance coupled between said second node and a third electrical voltage;

first means for sensing said data bit stored in said first and second transistors in response to a READ signal, said first means not substantially affecting current flow through said first and second transistors, and said first means further operative for supplying READ data outputs; and, second means for setting said data bit to be stored in said first and second transistors in response to a WRITE signal, said second means not substantially affecting total current flow through said first and second transistors, and said second means including means for supplying WRITE data inputs on lines different from those that supply READ data outputs; and a saturation prevention circuit including a third transistor having a collector, base, and first and second emitters, arranged such that said collector and said base of said third transistor are connected both together and to a fourth electrical voltage forming a fourth node, said first emitter of said third transistor connected to said first node and said second emitter of said third transistor connected to said second node, said saturation prevention circuit operative to turn on said third transistor to prevent saturation of said first and second transistors.

12. The circuit according to claim 11 wherein said first means comprises:

a fourth transistor having a collector, base, and emitter, arranged such that an access terminal connects to said collector of said fourth transistor, said base of said fourth transistor connects to said second node;

a fifth transistor having a collector, base, and emitter, arranged such that said emitter of said fifth transistor connects to said emitter of said fourth transistor forming a fifth node, said collector of said fifth transistor connects to an access terminal, and said base of said fourth transistor connects to said first node; and a sixth transistor having a collector, base, and emitter, arranged such that said collector of said sixth transistor connects to said fifth node, said base of said sixth transistor connects to an access terminal, and said emitter of said sixth transistor connects to another access terminal;

and wherein said second means comprises:

a seventh transistor having a collector, base, and emitter, arranged such that an access terminal connects to said base of said seventh transistor, said collector of said seventh transistor connects to said second node; and, an eighth transistor having a collector, base, and emitter, arranged such that said emitter of said eighth transistor connects to said emitter of said seventh transistor forming a sixth node, said base of said eighth transistor connects to an access terminal, and said collector of said eighth transistor connects to said first node;

a ninth transistor having a collector, base, and emitter, arranged such that said collector of said ninth transistor connects to said sixth node, said base of said ninth transistor connects to an access terminal, and said emitter of said ninth transistor connects to another access terminal.

13. The circuit according to claim 12 wherein said constant current source comprises:

a tenth transistor having a collector, base, and emitter, and a first resistor arranged such that said first resistor connects between said emitter of said tenth transistor and said first electrical voltage, said collector of said tenth transistor connects to said third node, and said base of said tenth transistor connects to a fifth electrical voltage, said fifth electrical voltage sets the current magnitude through said constant current source to a predetermined value.

14. The circuit according to claim 12 wherein said second and third electrical voltages are the same.

15. The circuit according to claim 14 wherein said fourth electrical voltage is approximately one-half of a base-emitter voltage drop less then said second and third voltages.

16. The circuit according to claim 15 wherein said constant current source comprises:

a tenth transistor having a collector, base, and emitter, and a first resistor arranged such that said first resistor connects between said emitter of said tenth transistor and said first electrical voltage, said collector of said tenth transistor connects to said third node, and said base of said tenth transistor connects to a fifth electrical voltage, said fifth electrical voltage sets the current magnitude through said constant current source to a predetermined value.

* * * * *